United States Patent [19]

Moon et al.

[11] Patent Number: 5,754,058

[45] Date of Patent: May 19, 1998

[54] OUTPUT BUFFER CONTROLLING CIRCUIT OF A MULTIBIT INTEGRATED CIRCUIT

[75] Inventors: Dae Young Moon; Gyu Suk Kim, both of Kyoungkido, Rep. of Korea

[73] Assignee: Hyundai Electronics Industries Co., Ltd., Kyoungkido, Rep. of Korea

[21] Appl. No.: 653,564

[22] Filed: May 24, 1996

[30] Foreign Application Priority Data

May 24, 1995 [KR] Rep. of Korea .................. 1995-13042

[51] Int. Cl.$^6$ ..................................... H03K 17/16
[52] U.S. Cl. ................... 326/26; 326/27; 326/83
[58] Field of Search ..................... 326/26, 27, 86; 327/379, 384, 387, 389, 391, 392, 393, 394, 395, 396, 398, 401

[56] References Cited

U.S. PATENT DOCUMENTS

| | | | |
|---|---|---|---|
| 4,587,445 | 5/1986 | Kanuma | 326/28 |
| 4,857,765 | 8/1989 | Cahill et al. | 326/26 |
| 4,958,086 | 9/1990 | Wang et al. | 327/380 |
| 5,194,763 | 3/1993 | Suzuki et al. | 326/27 |
| 5,572,145 | 11/1996 | Kinsella | 326/86 |
| 5,646,543 | 7/1997 | Rainal | 326/26 |

FOREIGN PATENT DOCUMENTS

| | | | |
|---|---|---|---|
| 59-212027 | 11/1984 | Japan | 326/26 |
| 4-219016 | 8/1992 | Japan | 326/26 |

Primary Examiner—Edward P. Westin
Assistant Examiner—Benjamin D. Driscoll
Attorney, Agent, or Firm—Jacobson, Price, Holman & Stern, PLLC

[57] ABSTRACT

An output buffer controlling circuit of a multibit integrated circuit is disclosed including: a pulse generating circuit for generating pulses by the combination of a first output enable signal and the output signal of an external sense amplifier; a high voltage sensing circuit for generating a high voltage sensing signal, when an input power voltage is high; and a delay circuit for generating a control signal for sequentially operating the output buffers in series so that the pulses generated from the pulse generating circuit have delay times different from one another according to the high voltage sensing signal generated from the high voltage sensing circuit.

3 Claims, 3 Drawing Sheets

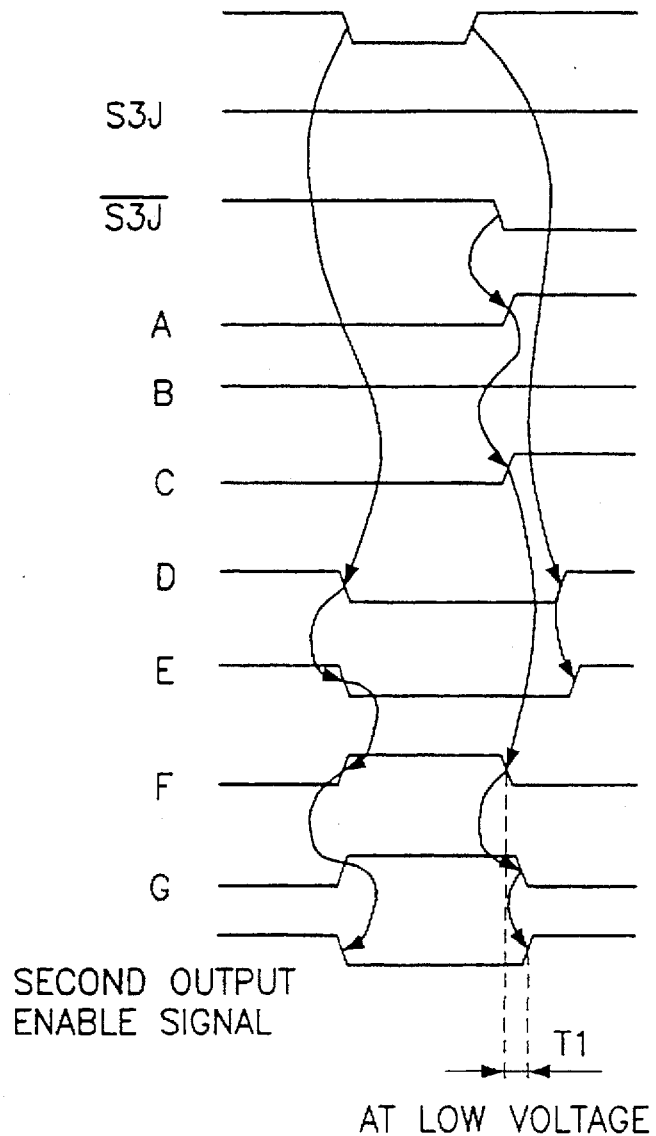

OUTPUT BUFFER CONTROLLING CIRCUIT OF A MULTIBIT INTEGRATED CIRCUIT

BACKGROUND OF THE INVENTION

The present invention relates to an output buffer controlling circuit of a multibit integrated circuit, and more particularly, to an output buffer controlling circuit which is capable of suppressing the variation of current for a peak current and time in the output buffer, thereby stabilizing the output of the output buffer at a high voltage and reducing noise.

In a conventional output buffer controlling circuit, when n output buffers are driven, a control signal inside of the circuit, an output enable signal, is divided into several signals and these divided signals are used for driving the output buffers. This is for the purpose of suppressing the variation of current for a peak current and time, by driving the output buffers with different time lags, to thereby reduce noise. However, if the drive voltage becomes higher, the output enable signals, which have been operating with a time lag, are almost simultaneously applied to the output buffers, and the output buffers are turned on. Here, the operation of the output buffer controlling circuit at a high voltage is suppressed by the increase of the variation of current for a peak current and time in the output buffer.

Accordingly, it is required that the access time of the integrated circuit be extended in order to maintain a constant time lag between the outputs of the output buffers even at a high voltage, by allowing large time lag between the output enable signals.

This delays its speed. Also, the output signal of a sense amplifier and the output enable signals are combined to thereby generate data. Here, if their timings do not coincide (when the timing of the output enable signal is faster than that of the output signal of the sense amplifier), all the output buffers are simultaneously turned on, and current (the variation of current for a peak current and time) is increased. This may generate noise.

SUMMARY OF THE INVENTION

It is an object of the present invention to provide an output buffer controlling circuit in which a constant time lag is maintained between output enable signals, which control the output buffer even at a low or high voltage by combining the output enable signals and an output of a sense amplifier and thus controlling the output enable signals, to suppress the variation of current for a peak current and time in the output buffer.

To accomplish the object of the present invention, there is provided an output buffer controlling circuit of a multibit integrated circuit, including: a pulse generating circuit for generating pulses by the combination of a first output enable signal and the output signal of an external sense amplifier; a high voltage sensing circuit for generating a high voltage sensing signal, when an input power voltage is high; and a delay circuit for generating a control signal for sequentially operating the output buffers in series so that the pulses generated from the pulse generating circuit have delay times different from one another according to the high voltage sensing signal generated from the high voltage sensing circuit.

BRIEF DESCRIPTION OF THE ATTACHED DRAWINGS

The novel features believed characteristic of the invention, as well as other features and advantages thereof, will best be understood by reference to the following detailed description of a particular embodiment, read in conjunction with the accompanying drawings, wherein:

FIG. 1 is a circuit diagram of an output buffer controlling circuit of a multibit integrated circuit according to the present invention; and FIG. 2 is a timing diagram of the output buffer controlling circuit of a multibit integrated circuit according to the present invention.

DETAILED DESCRIPTION OF PREFERRED EMBODIMENT

A preferred embodiment of the present invention will be explained below with reference to the accompanying drawings.

Figure 1:
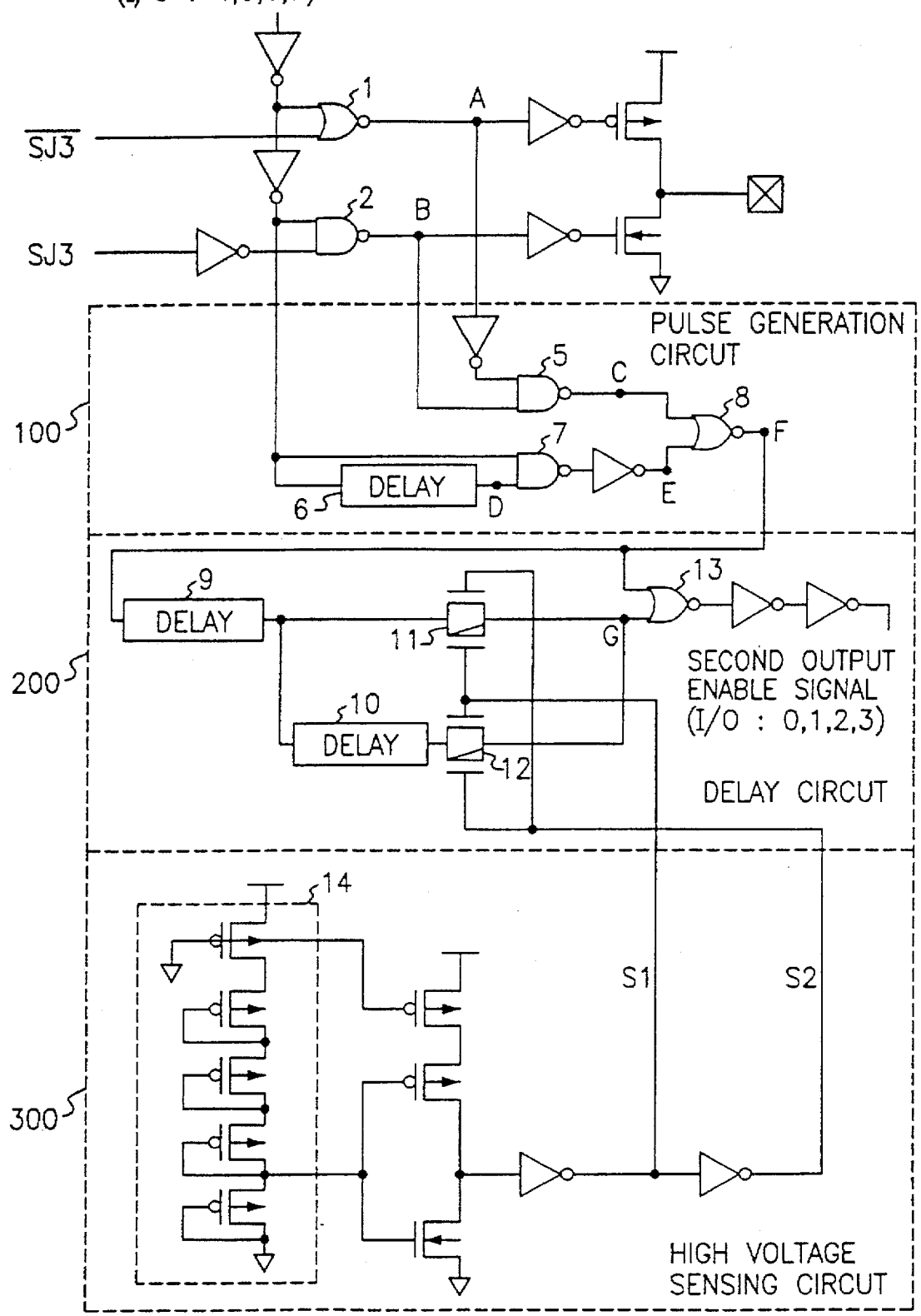
Figure 2B:
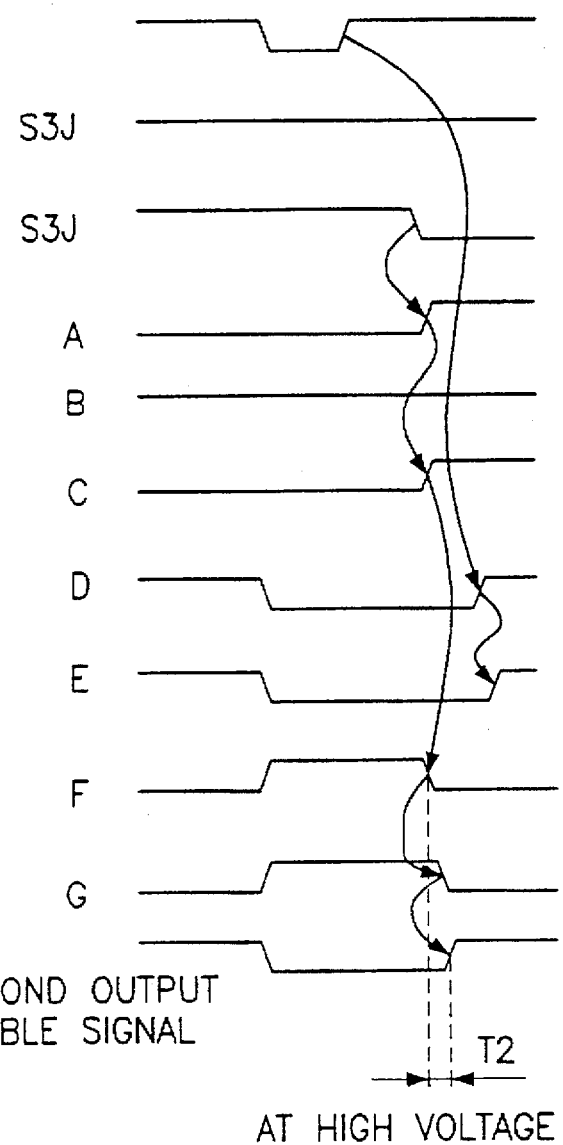

FIG. 1 is a circuit diagram of a control circuit which sequentially operates an output buffer of a multibit integrate circuit chip in series. In this figure, reference numerals 1.8 and 13 designate NOR gates, 2,5 and 7 NAND gates, 6,9 and 10 delayer, 11 and 12 switching elements, and 14 a high voltage sensing circuit, respectively. FIG. 2 is a timing diagram showing an operation in case that the outputs of the chip are controlled when the outputs are eight.

The configuration and operation of the output buffer controlling circuit of the present invention will be explained below with reference to FIGS. 1 and 2. A pulse generating circuit 100 receives a first output enable signal and the output signal of a sense amplifier of a final output stage, and generates a pulse. Here, the output signal of the sense amplifier consists of two signals. One is the output signal of the first NOR gate 1 which receives the inverted first output enable signal and the output signal of the sense amplifier of the final output terminal, and the other is the output signal of the first NAND gate 2 which receives the first output enable signal and the output signal of the sense amplifier.

A high voltage sensing circuit 300 senses the high voltage state of a power supply using a plurality of PMOS gates connected to the power supply, and generates an inverted signal S1 and the noninverted signal S2. A delay circuit 200, in order to receive the output of pulse generating circuit 100 and generate a control signal (second output enable signal) for sequentially operating the output buffers in series, uses an output signal of the high voltage sensing circuit 300 as a control signal. When the power voltage is normal, the delay circuit 200 generates the second output enable signal by NORing the output signal of the pulse generating circuit 100 and its delayed signal. On the other hand, in case that the power voltage is high, the delay circuit 200 generates the second output signal by NORing the output signal of the pulse generating circuit 100 and its twice delayed signal. The second output enable signal serves as the control signal which sequentially operates the output buffer in series.

The first NOR gate 1 receives the inverted first output enable signal and the output signal SJ3 of the sense amplifier, and supplies its output signal to the final output stage. The first NAND gate 2 receives the first output enable signal and the output signal SJ3 of the sense amplifier, and supplies its output signal to the final output stage. Here, the first NOR gate 1 and the first NAND gate 2 are circuit elements which are included in a conventional multibit integrated circuit to construct its output stage.

The pulse generating circuit 100 consists of the second and the third NAND gates 5 and 7, the first delayer 6 and the second NOR gate 8. The second NAND gate 5 receives the signal of the final output stage, which is output from the first NOR gate 1, and supplies its output signal to the second NOR gate 8. The first delayer 6 receives the first output enable signal and delays it by a predetermined time, and then supplies its output signal to the third NAND gate 7. The third NAND gate 7 receives the first output enable signal and the output signal of the first delayer 6, and supplies its output signal to the second NOR gate 8. The second NOR gate 8 receives the output signal of the second NAND gate 5 and the inverted signal of the output signal of the third NAND gate 7, and generates the output signal of the pulse generating circuit 100, that is, the delay circuit controlling pulse.

The high voltage sensing circuit 300 generates a signal when a high voltage is applied to the power supply. The high voltage sensing portion 14 generates a sensing signal when the received power voltage becomes three times higher than the reference voltage. The inverted signal S1 of the output signal of the high voltage sensing portion 14, and the inverted signal of the inverted signal S2 are applied to the delay circuit 200.

In the delay circuit 200, the second delayer 9 receives the output signal of the pulse generating circuit 200, and delays it. The third delayer 10 delays the output signal of the second delayer 9. The output stages of the second delayer 9 and the third delayer 10 are respectively connected to the switches 11 and 12 each of which consists of CMOS formed with NMOSFET and PMOSFET. The operations of the switches 11 and 12 are controlled according to the output signal of the high voltage sensing circuit 300. If the output signal S1 of the high voltage sensing circuit 300 is logic "1", the second switch 12 is turned on, and the output of the third delayer 10 passes through the second switch 12. On the other hand, if the signal S2 is logic "1", the first switch 11 is turned on, and the output of the second delayer 9 passes through the first switch 11. In other words, if the signal S1 is logic "1", the twice delayed signal of the output signal of the pulse generating circuit 100 passes through the second switch 12, and if the signal S2 is logic "1", the delayed signal of the output signal of the pulse generating circuit 100 passes through the first switch 11.

The signals passed through switches 11 and 12 are connected to one input of the third NOR gate 13 connected to the output terminal of the switches. The output signal of the pulse generating circuit 100 is connected to the other input of third NOR gate 1. The first NOR gate 1 generates the second output enable signal, that is, the control signal for another internal circuit.

In the output buffer controlling circuit of the present invention, the second output enable signal is generated from the output signal of the NAND gate 5 of the pulse generating circuit, which resulted from the combination of the first output enable signal and the output signal of the final sense amplifier, dissimilar to the conventional output buffer controlling circuit in which the first and second output enable signals are generated from one output buffer. Accordingly, the first and second output enable signals are in a serial state. By doing so, in case that input/output pins are eight, input/output 4,5,6 and 7, and input/output 0,1,2 and 3 are not simultaneously open or closed. Also, according to the increase of the voltage, a path through the first delayer to the first switch, or through the second delayer, the third delayer and second switch is determined according to the operation of the high voltage sensing circuit 300. The second and third delayers are to maintain the time lag between the output enable signals uniformly. As described above, since the first and second output enable signals are separately operated from each other, the differential value of the peak current, and of current to time is suppressed, which is caused by the output buffer. Accordingly, the operation of the output buffer is stabilized even at a high voltage, and noise is reduced.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. An output buffer controlling circuit of a multibit integrated circuit, comprising:

pulse generating means for generating pulses by the combination of a first output enable signal and the output signal of an external sense amplifier;

high voltage sensing means for generating a high voltage sensing signal, when an input power voltage is high; and delaying means for generating a control signal for sequentially operating a plurality of output buffers in series so that said pulses generated from said pulse generating means have delay times different from one another according to said high voltage sensing signal generated from said high voltage sensing means.

2. The output buffer controlling circuit of a multibit integrated circuit as claimed in claim 1, wherein said pulse generating means comprises:

a second NAND gate for receiving a first drive signal and a second drive signal, said first drive signal being the inverted output signal of a NOR gate, said NOR gate receiving said first output enable signal and the output signal of said external sense amplifier, said second drive signal being the output signal of a first NAND gate, said first NAND gate receiving said first output enable signal and the output signal of said external sense amplifier;

a delayer for delaying said first output enable signal;

a third NAND gate for receiving said first output enable signal and the output signal of said delayer; and a NOR gate for receiving the output signal of said second NAND gate and the inverted output signal of said third NAND gate.

3. The output buffer controlling circuit of a multibit integrated circuit as claimed in claim 1, wherein said delaying means comprises:

a first delayer for receiving the output signal of said pulse generating means;

a second delayer for delaying the output signal of said second delayer;

switching means for outputting the output signal of said first delayer, or the output signal of said second delayer, the operations of said switching means being controlled according to the output signal of said high voltage sensing means; and a NOR gate for receiving the output signal of said pulse generating means and the output signal of said switching means, and generating a second output enable signal.

* * * * *